United States Patent
Muddu

(10) Patent No.: US 6,732,065 B1
(45) Date of Patent: *May 4, 2004

(54) NOISE ESTIMATION FOR COUPLED RC INTERCONNECTS IN DEEP SUBMICRON INTEGRATED CIRCUITS

(75) Inventor: Sudhakar Muddu, Santa Clara, CA (US)

(73) Assignee: Silicon Graphics, Incorporated, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/301,863

(22) Filed: Apr. 29, 1999

(51) Int. Cl.$^7$ .......................... G06F 17/10; G06F 17/50; G06F 9/45; G06G 7/62
(52) U.S. Cl. .............................. 703/2; 703/13; 703/14; 716/5; 716/6
(58) Field of Search ................................ 703/2, 13–14; 716/5–6

(56) References Cited

U.S. PATENT DOCUMENTS

| | | | |
|---|---|---|---|
| 5,285,165 A | 2/1994 | Renfors et al. | ............. 328/167 |
| 6,314,546 B1 * | 11/2001 | Muddu | ........................... 716/5 |
| 6,353,917 B1 * | 3/2002 | Muddu et al. | .................. 716/6 |

FOREIGN PATENT DOCUMENTS

JP  2-189917  7/1990

OTHER PUBLICATIONS

Kahng et al.; "Delay analysis of coupled transmission lines" IEEE Asia Pacific Conf. Ckts & Sys.; pp. 81–84; Nov. 1996.*

Kahng et al.; "Efficient gate delay modeling for large interconnect loads"; IEEE MCMC–96; pp. 202–207; Feb. 1996.*

Kahng et al.; "Two–pole analysis of interconnection trees"; IEEE MCMC–95; pp. 105–110; Feb. 1995.*

Ott; "Noise reduction techniques in electronic systems" John Wiley & Sons; 1988; TOC & chapters 1–2.*

(List continued on next page.)

*Primary Examiner*—Hugh Jones
(74) *Attorney, Agent, or Firm*—Squire, Sanders & Dempsey L.L.P.

(57) ABSTRACT

Noise estimation for coupled interconnects in deep submicron integrated circuits. One aspect of the invention is a method for interconnect coupling noise estimation. Another aspect of the invention is a computer readable medium embodying computer program code. The computer program code is configured to cause a computer to perform steps for estimating the interconnect coupling noise. The interconnect coupling noise estimation (hereafter noise estimation) includes modeling a circuit. The circuit includes a pair of interconnects, each interconnect connecting a driver gate to a load gate, where signal activity at a first interconnect of the pair of interconnects is having an impact on a second interconnect of the pair of interconnects. The circuit modeling includes modeling the first and second interconnects, driver gates, and load gates. Driver gates are modeled using a voltage source driving a resistance. Load gates are modeled using a capacitance. The noise estimation further includes expressing transfer characteristics of the modeled circuit for one of or, each one at a time, for a plurality of input voltages including step and ramp input voltages. Additionally, the noise estimation includes expressing a voltage at the second interconnect based on the transfer characteristics. The transfer characteristics are expressed in view of a capacitive coupling between the first and second interconnects. The voltage represents the impact on the second interconnect that is in the form of interconnect coupling noise. The noise estimation also includes determining a peak value of the interconnect coupling noise from the expression for the voltage at the second interconnect. The interconnect coupling noise reaches a peak at a time determined for one of or, each one at a time, for both of the step and ramp input voltages.

13 Claims, 10 Drawing Sheets

OTHER PUBLICATIONS

Eo et al.; "Simulations and measurements of picosecond signal transients, propagation, and crosstalk on lossy VLSI interconnect"; IEEE Trans. Comp., Pack., and Manuf. Tech.; pp. 215–225; Mar. 1995.*

Kahng et al.; "Delay models for MCM interconnects when response is non–monotone"; IEEE MCMC '97; pp. 102–107; Feb. 1997.*

H.B. Bakoglu, "Circuits, Interconnections, and Packaging for VLSI," Addison–Wesley Publishing Company, 1990, pp. 202–207, 212–215, 282–285.

A. Devgan, "Efficient Coupled Noise Estimation for On–Chip Interconnects," IEEE International Conference on Computer–Aided Design, Nov. 1997, pp. 147–151.

A.B. Kahng, K. Masuko and S. Muddu, "Analytical Delay Models for VLSI Interconnects Under Ramp Input," Published in IEEE/ACM International Conference on CAD, Nov. 1996, 7 pages.

G.A. Katopis and H.H. Smith, "Coupled Noise Predictors for Lossy Interconnects," IEEE Transactions on Components, Packaging, and Manufacturing Technology–Part B. vol. 17, No. 4, Nov. 1994, pp. 520–524.

H. Kawaguchi and T. Sakurai, "Delay and Noise Formulas for Capacitively Coupled Distributed RC Lines," Proc. Asian and South Pacific Design Automation Conference, 1998, pp. 35–43.

K. Rahmat, O.S. Nakagawa, S–Y. Oh and J. Moll, "A Scaling Scheme for Interconnect in Deep–Submicron Processes," IEEE International Electronic Devices Meeting, 1995, pp. 10.2.1–10.2.4.

K.L. Shepard, S.M. Carey, E.K. Cho, B.W. Curran, R.F. Hatch, D.E. Hoffman, S.A. McCabe, G.A. Northrop, R. Seigler, "Design Methodology for the S/390 Parallel Enterprise Server G4 Microprocessors," IBM Journal of Research and Development, vol. 41, No. 4/5, Jul./Sep. 1997, pp. 515–547.

A. Vittal and M. Marek–Sadowska, "Crosstalk Reduction for VLSI," IEEE Transactions on Computer–Aided Design of Integrated Circuits and Systems, vol. 16, No. 3, Mar. 1997, pp. 290–298.

G. Yee, R. Chandra, V. Ganesan and C. Sechen, "Wire Dleay In the Presence of Crosstalk," ACM/IEEE International Workshop on Timing Issues in the Specification and Synthesis of Digital Systems, Dec. 97, pp. 170–175.

K.L. Shepard and V. Narayanan, "Conquering Noise in Deep–Submicron Digital Ics," IEEE Design & Test of Computers, Jan.–Mar. 1998, pp. 51–62.

K. Rahmat, J. Neves and J.F. Lee, "Methods for calculating noise in early design: a comparative analysis," IEEE 1998, pp. 76–81.

R. Macys and S. McCormick, "A New Algorithm for Computing the Effective Capacitance in Deep Submicron Circuits," IEEE Custom Integrated Circuits Conference, 1998, pp. 313–316.

A.B. Kahng and S. Muddu, "An Analytical Delay Model For RLC Interconnects," IEEE 1996, 4 pages.

Semiconductor Industry Association, National Technology Roadmap for Semiconductors, pages Table of Contents, pp. 1–3, 7–19, 23–113, 163–178, Appendix B1–C8, 1994.

Personal communication, SIA NTRS 1997 Revision, Design and Test Technology Working Group (chairs: R. Howard, P. Verhofstadt), 1997, Table of Contents, pp. 1–3, 8, 10–17, 25–38, 94–109, Appendix B, C and D, 1997.

C. J. Alpert and A. Devgan, "Wire Segmenting for Improved Buffer Insertion", Proc. Design Automation Conf., pp. 558–593, Jun. 1997.

D. P. LaPotin, U. Ghoshal, E. Chiprout, S. R. Nassif, "Physical Design Challenges For Performance", International Symposium on Physical Design, pp. 225–226, Apr. 1997.

L. Scheffer, "A Roadmap Of CAD Tool Changes For Sub–Micron Interconnect Problems", International Symposium on Physical Design, pp. 104–109, Apr. 1997.

R. F. Sechler, "Interconnect design with VLSI CMOS", IBM Journal of Research and Development, pp. 23–31, Jan.–Mar. 1995.

J. Cong, L. He, A.B. Kahng, D. Noice, N. Shirali and S. H.–C. Yen, Analysis And Justification Of A Simple, Practical 2 1/2–D Capacitance Extraction Methodology, Proc. Design Automation Conference, pp. 627–632, Jun. 1997.

L. Gwennap, "IC Vendors Prepare for 0.25–Micron Leap", Microprocessor Report, pp. 11–15, Sep. 16, 1996.

A. B. Kahng and S. Muddu, "Efficient Gate Delay Modeling For Large Interconnect Loads", Proc. IEEE Multi–Chip Module Conference, 6 pages, Feb. 1996.

S.Y. Oh, K.–J. Chang, N. Chang and K. Lee, "Interconnect Modeling And Design In High–Speed VLSI/ULSI Systems", Proc. International Conference on Computer Design: VLSI in Computers and Processors, pp. 184–189, Oct. 1992.

W.C. Elmore, "The Transient Response Of Damped Linear Networks with Particular Regard To Wideband Amplifiers," Journal of Applied Physics, vol. 19, Jan.–Dec. 1948, pp. 55–63.

A.B. Kahng and S. Muddu, "A Glossary On Analysis And Modeling Of VLSI Interconnections," marked Confidential, including Contents, Feb. 1996, 3 pages.

S.P. McCormick, "Modeling and Simulation of VLSI Interconnections with Moments," RLE Technical Report No. 543, PhD Thesis, MIT, May 1989.

J.K. Ousterhout, "A Switch–Level Timing Verifier For Digital MOS VLSI," IEEE Transactions on Computer–Aided Design, vol. CAD–4, No. 3, Jul. 1985, pp. 336–349.

P.R. O'Brien and T.L. Savarino, "Modeling the Driving–Point Characteristic Of Resistive Interconnect For Accurate Delay Estimation," Proc. IEEE, 1989, pp. 512–515.

P.R. O'Brien and T.L. Savarino, "Efficient On–Chip Delay Estimation For Leaky Models Of Multiple–Source Nets," Proc. IEEE 1990, Custom Integrated Circuits Conference, pp. 9.6.1–9.6.4.

L.T. Pillage, "Asymptotic Waveform Evaluation For Timing Analysis," IEEE Transactions on Computer–Aided Design, vol. 9, No. 4, Apr. 1990, pp. 352–366.

J. Qian, S. Pullela and L. Pillage, "Modeling The Effective Capacitance For The RC Interconnect Of CMOS Gates," IEEE Transactions on Computer–Aided Design of Integrated Circuits and Systems, vol. 13, No. 12, Dec. 1994, pp. 1526–1535.

J. Rubinstein, P. Penfield, Jr. And M.A. Horowitz, "Signal Delay in RC Tree Networks," IEEE Transactions on Computer–Aided Design, vol. CAD–2, No. 3, Jul. 1983, pp. 202–211.

C.L. Ratzlaff, S. Pullela and L. T. Pillage, "Modeling The RC–Interconnect Effects In A Hierarchical Timing Analyzer," IEEE Custom Integrated Circuits Conference, May 1992, pp. 15.6.1–15.6.4.

Synopsys, "Design Compiler Family Reference Manual," Version 3.3a, Mar. 1995, pp. 8–1–8–5.

T. Sakurai, "Closed–Form Expressions for Interconnection Delay, Coupling, and Crosstalk in VLSI's", IEEE Transactions on Electron Devices, vol. 40, No. 1, pp. 118–124, Jan. 1993.

* cited by examiner

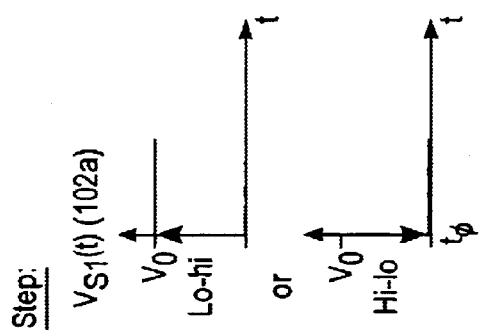
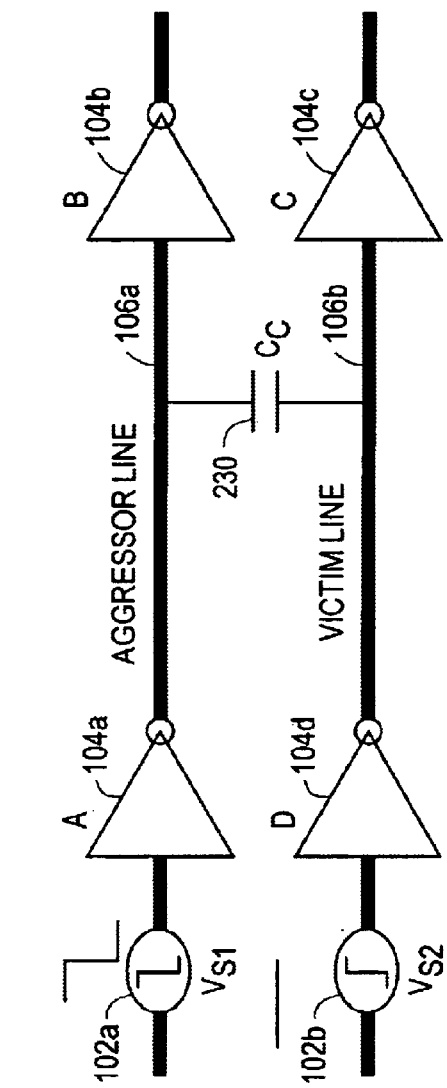
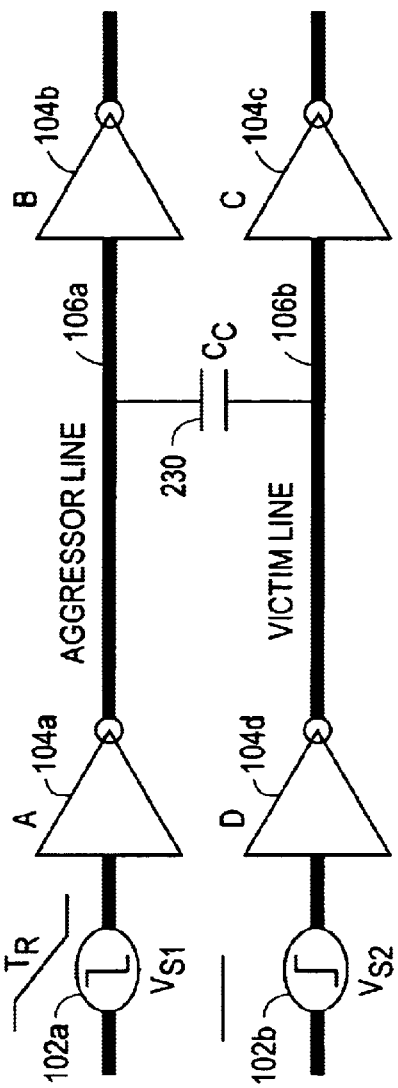
FIG. 5a (A) STEP INPUT
FIG. 5b (B) RAMP INPUT

CASE 2: VICTIM AND AGGRESSOR SWITCHING IN OPPOSITE DIRECTIONS
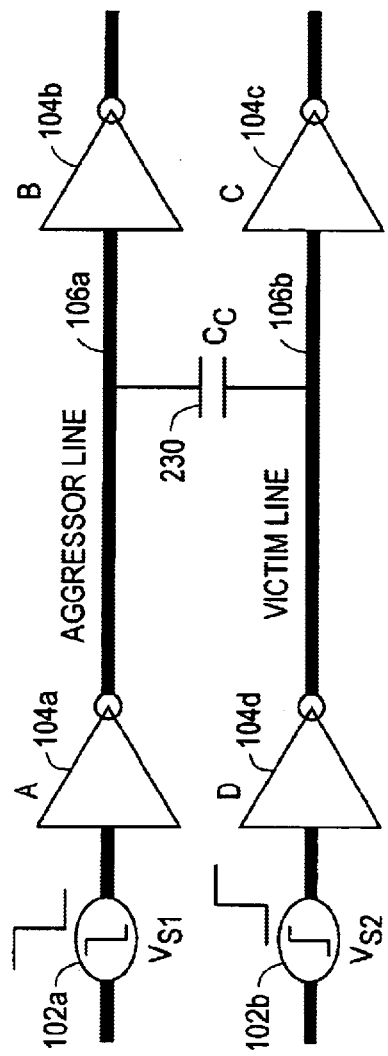
FIG. 6a (A) STEP INPUT
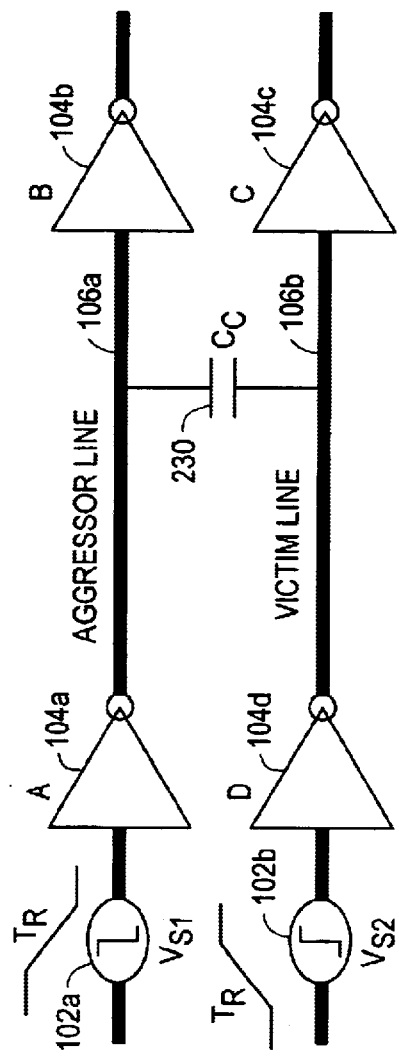
FIG. 6b (B) RAMP INPUT CASE 3: VICTIM AND AGGRESSOR SWITCHING IN SAME DIRECTION
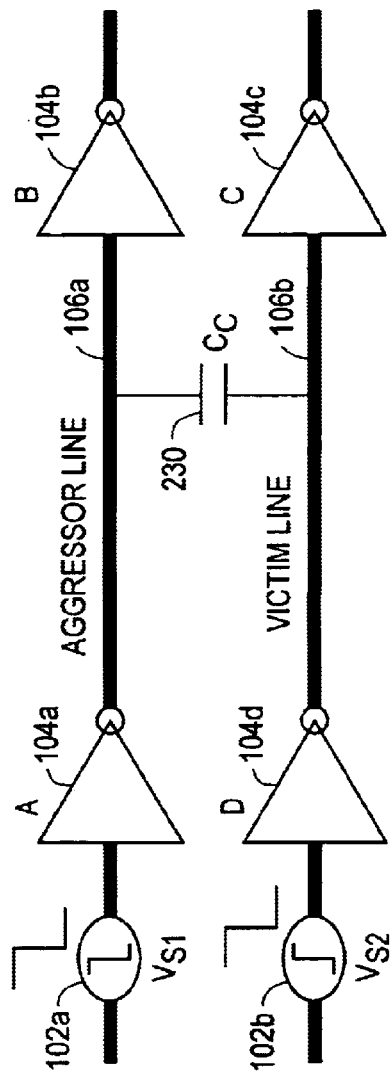
FIG. 7a (A) STEP INPUT
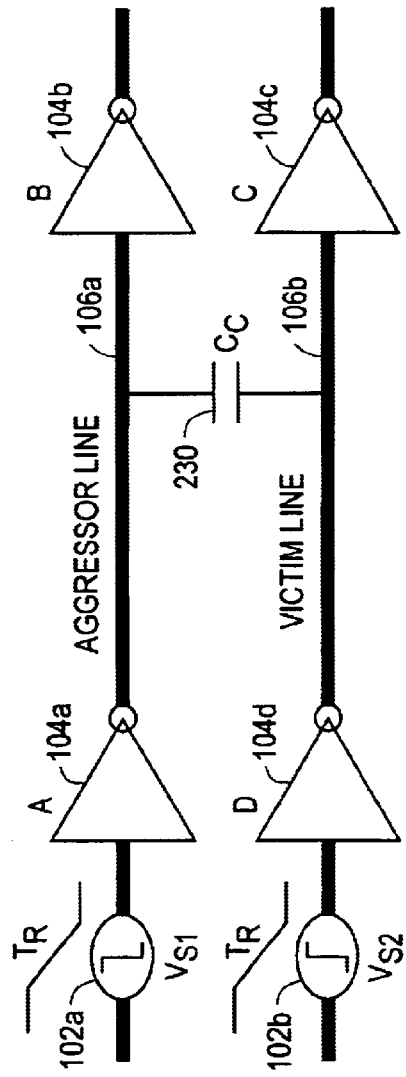
FIG. 7b (B) RAMP INPUT

NOISE ESTIMATION FOR COUPLED RC INTERCONNECTS IN DEEP SUBMICRON INTEGRATED CIRCUITS

RELATED APPLICATIONS

This application is related to and incorporates herein by reference co-pending U.S. application Ser. No. 09/276,992 entitled "Interconnect Capacitive Effects Estimation," filed Mar. 26, 1999, and assigned to the assignee of the present invention.

FIELD OF THE INVENTION

This application relates to integrated circuit design automation and, specifically, to interconnect coupling noise estimation.

BACKGROUND OF THE INVENTION

From the point of view of integrated circuit (IC) analysis, transfer characteristics are a common thread that runs through essentially all integrated circuit elements. Transfer characteristics represent the behavior of IC elements, including their speed of switching from one state to the other in response to a voltage inducement.

A typical IC includes an array of IC elements that forms one or more multistage circuits. IC elements are selected from a library of cells also known as gates. In the IC, the gates are interconnected by a pattern of conductive material lines that carry signals (voltage, current) between the gates. Interconnect lines are frequently referred to as interconnect wires or, simply, interconnects.

In deep submicron ICs, adjacent interconnect lines are placed in close proximity to each other. The close proximity between interconnect lines forms therebetween a parasitic element in the form of capacitive coupling. Crosstalk between the interconnect lines results from this capacitive coupling (inductive coupling is not addressed.) For example, when a signal is carried by an interconnect line between cascaded gates of a multistage circuit this signal influences additional gate(s) connected to a different, closely proximate interconnect line. The coupling capacitance grows with increases in the average length and routing density of interconnect lines. Hence crosstalk becomes more critical at faster gate switching speeds.

In general, noise voltage can be generated internally in a gate or introduced into the gate. Internally in the gate, noise voltage represents inherent random energy produced by thermal agitation or fluctuation in the number of charge carriers that flow within the gate. Crosstalk introduces noise voltage into the gate due to the capacitive coupling between adjacent interconnect lines. Crosstalk noise voltage is also referred to as interconnect coupling noise.

If a noise voltage is induced into a gate, the noise voltage can cause a spurious transition from one state to another. Because interconnect coupling noise can cause gates to falsely switch from one state to the other, interconnect coupling noise increasingly limits the performance of high-speed VLSI (very large scale integration) circuits.

Circuit modeling is a useful method for estimating interconnect coupling noise values. Circuit modeling is an approximation of gates and interconnect lines. Networklike circuit-models include circuit elements such as resistances and capacitances for approximating the gates and interconnect lines.

Several methods exist for estimating interconnect coupling noise. One of the methods, a noise prediction method using a capacitance value multiplied by a switching factor, is not accurate nearly enough because this method produces highly optimistic or pessimistic predictions. This method uses the capacitance value to model the coupling capacitance between a pair of adjacent interconnect lines. The switching factor is slightly more than zero for a pair of lines switching in the same direction, and slightly less than two for a pair of lines switching in the opposite direction.

Alternatively, some conventional methods use an L model for modeling interconnect lines. However, such methods include specific assumptions and provide noise estimation and analysis only for a step input voltage. One of the assumptions for cascaded gates (i.e., a driver gate in series with and driving a load gate) is:

$$R_{driver} << R_{interconnect};$$

and $$C_{load} << C_{interconnect},$$

where, $R_{driver}$ approximates the driver, $C_{load}$ approximates the input impedance of the load gate, and $R_{interconnect}$ and $C_{interconnect}$ represent the interconnect line.

Furthermore, such methods iteratively evaluate the noise for different resistance-capacitance ratios. The specific assumptions are made in each iteration. As a special case, some of these methods do not take into account the interconnect resistance while deriving noise expressions. That is, the interconnect resistance is assumed to be zero ohms. Also, the error in noise estimation based on electrical properties of modeled circuits increases as the rise time decreases.

Design automation tools use circuit modeling in pre-layout estimation of IC behavior and in post-layout IC performance analysis. Accurate estimation and analysis depend closely on accurate modeling. Thus, efficient and more accurate modeling is needed. The present invention addresses these and related issued.

SUMMARY OF THE INVENTION

The present invention provides a more accurate interconnect coupling noise estimation. A preferred embodiment of the present invention provides noise estimation for coupled interconnects in deep submicron integrated circuits. By providing more accurate circuit modeling techniques that employ L and Π models, the invention produces a more accurate yet more general noise estimation. The accuracy achieved in the Π model case is superior.

The L and Π models are driven by one of or, one at a time, a plurality of input voltages having step, ramp or other waveforms Namely, the principles of the invention apply equally well to input voltages with other than step or ramp wave-forms because input voltages of other wave-forms can be expressed, for example, as a piece-wise series of ramps. In other words, the invention provides a more accurate interconnect coupling noise estimation for any input voltage, whether having step, ramp or other wave-form.

With these circuit modeling techniques, analytical expressions of a noise voltage at a victim interconnect line describe the impact of capacitive coupling between an aggressor interconnect line and the victim interconnect line. Any one of a plurality of aggressor interconnect lines that is proximate to the victim interconnect line may be capacitively coupled to the victim interconnect line. Hence, signal activity at any of such aggressor interconnect lines produces an impact on the victim interconnect line via the respective capacitive coupling. As indicated, this impact can be determined for input voltages having step, ramp or any other wave-forms.

In accordance with a purpose of the invention, a computer system can be used in which an embodiment of the invention is implemented. The invention can be implemented in the computer system as a separate tool or as part of other design automation tools. For implementing an embodiment of the invention in the computer system, the principles presented above can be stored in a computer readable medium in the form of computer program code. Moreover, the library of cells (gate library) may be stored in a computer readable medium. The computer readable medium includes internal or external, fixed or removable, computer memory.

The improved modeling accuracy and, in turn, the more accurate interconnect coupling noise predictions are advantageous in several respects. One advantage is improved analysis of circuit performance sensitivity to various interconnect tuning parameters. Another advantage is the lesser overdesign and guardbanding in high-performance designs. Yet another advantage is the shorter runtime it takes to analyze the circuits when using a computer to embody the invention. These advantages apply at all stages of a performance-convergent synthesis and layout methodology. Finally, the approach presented herein can be advantageously used as an analytical tool to estimate the impact of noise voltage peaks early on in the physical design cycle of integrated circuits such as microprocessors, ASIC (application specific IC) or any other custom-designed IC.

In accordance with the purpose of the invention, as embodied and broadly described herein, the invention relates to noise estimation for coupled interconnects in deep submicron integrated circuits. One aspect of the invention is a method for interconnect coupling noise estimation. Another aspect of the invention is a computer readable medium embodying computer program code. The computer program code is configured to cause a computer to perform steps for estimating the interconnect coupling noise.

The interconnect coupling noise estimation includes modeling a circuit, where capacitive (and not inductive) coupling is included. The circuit includes a pair of interconnects each connecting between a driver gate and a load gate, where signal activity at a first interconnect of the pair of interconnects is having an impact on a second interconnect of the pair of interconnects. The circuit modeling includes modeling the first and second interconnects, the driver gate and the load gate.

A driver gate is modeled using a Thévenin equivalent where the gate is replaced by an input voltage source in series with a resistance. A load gate is modeled by a capacitance that approximates the input impedance of the load gate.

The noise estimation further includes expressing transfer characteristics of the modeled circuit for one of or, each one at a time, for the plurality of input voltages including the step and ramp input voltages. Additionally, the noise estimation includes expressing a voltage at the second interconnect based on the transfer characteristics. The voltage, in turn, represents the interconnect coupling noise at the victim interconnect line due to the capacitive coupling between the aggressor and interconnect lines. Namely, accounting for the capacitive coupling between the first (aggressor) and second (victim) interconnect lines, the transfer characteristics determine the voltage at the interconnect line. In fact, the transfer characteristics may be also referred to as coupling transfer characteristics.

The noise estimation further includes determining a peak value of the interconnect coupling noise from the expression for the voltage at the second interconnect. The interconnect coupling noise reaches a peak at a time determined for one of or, each one at a time, for the plurality of input voltages.

Advantages of the invention will be set forth, in part, in the description that follows and, in part, will be understood by those skilled in the art from the description herein. The advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIGS. 5a and 5b illustrate a pair of multistage circuits in accordance with a noise estimation embodiment of the invention, in which a victim interconnect line is quiet at constant voltage; in FIG. 5a, the circuits are driven by a step input voltage, and in FIG. 5b, the circuits are driven by a ramp input voltage;

FIGS. 6a and 6b illustrate a pair of multistage circuits in accordance with a noise estimation embodiment of the invention, in which a victim interconnect line is active and switching in a direction opposite to the aggressor's switching direction; in FIG. 6a, the circuits are driven by a step input voltage, and in FIG. 6b, the circuits are driven by a ramp input voltage; and FIGS. 7a and 7b illustrate a pair of multistage circuits in accordance with a modeling embodiment of the invention, in which a victim interconnect line is active and switching in a same direction as the aggressor's switching direction; in FIG. 7a, the circuits are driven by a step input voltage, and in FIG. 7b, the circuits are driven by a ramp input voltage.

DETAILED DESCRIPTION OF A PREFERRED EMBODIMENT

The present invention relates to interconnect coupling noise estimation in integrated circuit (IC) design automation. The invention provides improved, easy to obtain interconnect coupling noise estimates for both step and ramp input voltages. This approach is more general, yet more accurate. The invention improves interconnect coupling noise estimation by providing more accurate circuit modeling that employs L and Π models driven by the step and ramp input voltages. The more accurate predictions of interconnect coupling noise advantageously reduces the need for overdesign and guardbanding in high-performance system designs.

Reference will now by made in detail to preferred embodiments of the invention, examples of which are illustrated in the accompanying drawings. Wherever convenient, the same reference numbers will be used throughout the drawings to refer to the same or like parts.

Figure 1:
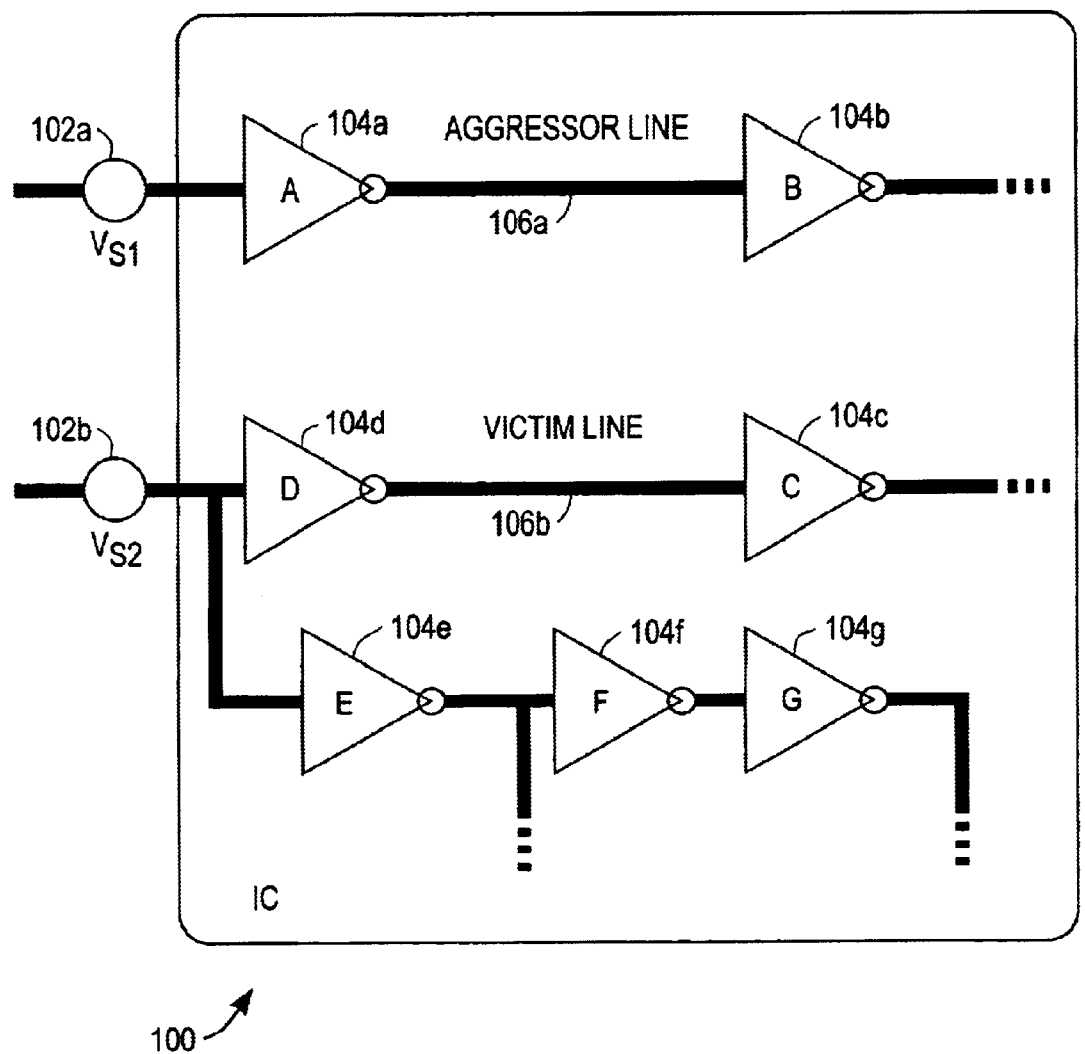
FIG. 1 illustrates an example of an integrated circuit (IC) in accordance with a noise estimation embodiment of the invention.

In accordance with the purpose of the invention, as embodied and broadly described herein, the invention provides more accurate modeling for IC design automation tools. IC design automation tools can use this circuit modeling in pre-layout estimation of IC behavior and in post-layout IC performance analysis. IC layout and logic synthesis can both be optimized when using the more accurate circuit modeling. FIG. 1, is an example of an IC 100.

Figure 2A:
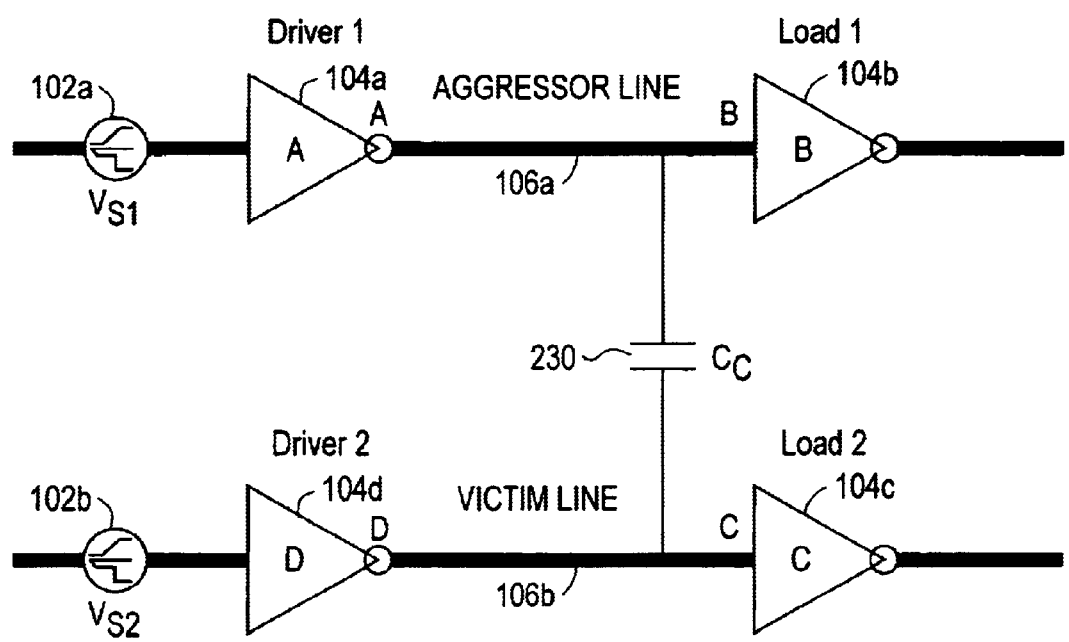
FIG. 2a illustrates two pairs of cascaded gates in the IC of FIG. 1 in accordance with a noise estimation embodiment of the invention.

The more accurate circuit modeling is a near approximation of cascaded gates 104 in multistage circuits of the IC 100. For example, cascaded gates 104a and 104b are a driver gate 104a that is connected in series with and driving a load gate 104b. When connected by the interconnect line 106, the driver and load gates 104 form a multistage circuit. The more accurate circuit modeling takes into account the distributed impedance nature of interconnect lines 106 and provides both L and Π models of the interconnect lines 106. As will be further explained below, the interconnect coupling noise estimation and analysis uses both step and ramp input voltages 102 to drive these circuit models. FIG. 2a illustrates two pairs of cascaded gates 104 in the IC of FIG. 1.

As shown, each pair of cascaded gates 104 is connected by a respective interconnect line 106. The two interconnect lines 106 are closely proximate and capacitively coupled by a (parasitic) coupling capacitance 230. Signal (voltage, current) activity (switching, ramping) at interconnect line 106a is reflected at interconnect line 104b because of crosstalk to interconnect line 104b via the coupling capacitance 230. Namely, the crosstalk induces interconnect coupling noise into interconnect line 104b due to the coupling capacitance. For this reason, interconnect lines 106a and 106b are referred to as aggressor and victim lines, respectively.

Figure 2B:
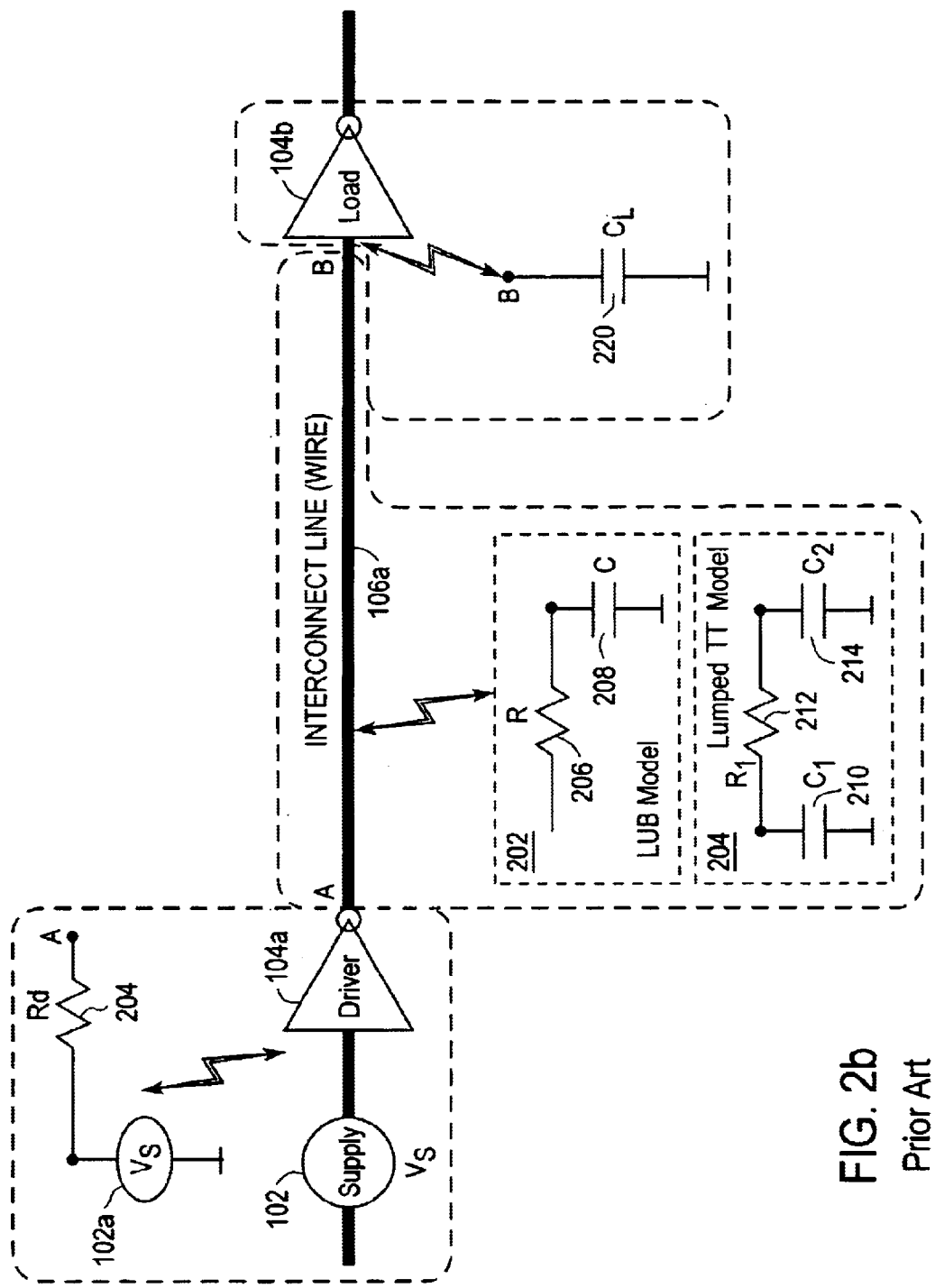
FIG. 2b illustrates circuit modeling of elements in the circuit of FIG. 2a according to an embodiment of the invention.

FIG. 2b illustrates possible circuit modeling of a pair of cascaded gates 104 connected by an interconnect line 106a. Other pairs of cascaded gates can be modeled in like manner and need not be illustrated separately. Namely, each of the aggressor and victim interconnect lines 106a and 106b of FIG. 2a can be modeled as shown in FIG. 2b.

Figure 2C:
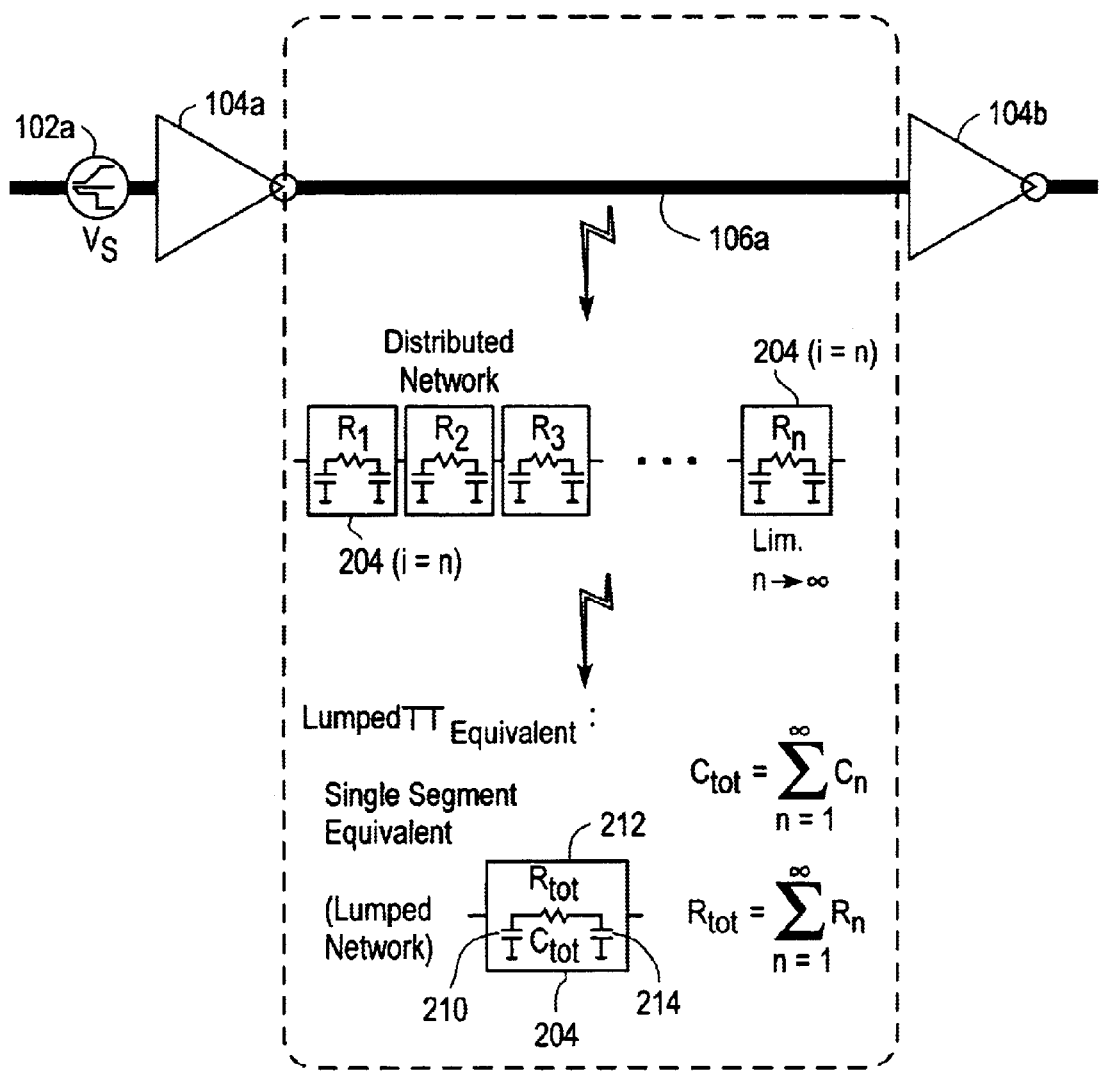
FIG. 2c illustrates distributed network characteristics of an interconnect line impedance in accordance with a modeling embodiment of the invention.

For this circuit modeling, the L and Π models 202 and 204 can be viewed as networklike circuit models. These circuit models include circuit elements such as resistances. 206 or 212 and capacitances 208 or 210 and 214 that are used for nearly approximating the interconnect line 106a. The cascaded gates 104, the driver gate 104a and the load gate 104b, are each represented by an equivalent circuit 204 and 220. Each of the equivalent circuits is connected to a respective end (A, B) of the interconnect line circuit model. The driver gate 104a is represented, for example, by its Thévenin equivalent resistance $R_d$, 204. The load gate 104b is represented by a load capacitance, $C_{load}$ 220. $C_{load}$ 220 approximates the input impedance ($C_{in}$) of the load gate 104b. As mentioned, the other pair of cascaded gates 104d and 104c can be similarly modeled. The circuit modeling, using both the L and Π models of the interconnect lines, is implemented for predicting the value, including a peak value, of the interconnect coupling noise. The Π model in this case is a single network segment that approximates each interconnect line. This Π model is also referred to as a lumped Π model. The lumped Π model approximates the distributed network characteristics of interconnect lines impedance. FIG. 2c illustrates the distributed network characteristics of an interconnect line impedance.

As shown in FIG. 2c, the interconnect line 106a (same goes for 106b) can be represented by a distributed network of Π (or L) models $204_i$ (i represents a number from 1 to n; L models are not shown here because the analysis is similar). Theoretically, the number of Π (or L) models, n, can reach infinity. The single network segment 204 (lumped Π model) is an equivalent of all the Π models combined, where each network (Π model) segment includes a resistance $R_1 \ldots R_n$, and a capacitance $C_1 \ldots C_n$. The combination of the resistance elements results in a total resistance ($R_{tot}$, labeled as $R_1$ 212 in FIG. 2b) as follows:

$$R_{tot} = \sum_{n=1}^{\infty} R_n.$$

The combination of the capacitance elements results in a total capacitance ($C_{tot}$, labeled as $C_1$ 210 in FIG. 2b) as follows:

$$C_{tot} = \sum_{n=1}^{\infty} C_n.$$

Hence, as shown in FIG. 2c, the lumped Π model is a single network segment 204 with two capacitors 210 and 214 and one total resistance 212.

As embodied, the invention provides a frequency (Laplace transform) domain analysis of the circuit models that is converted into time domain results (by taking the inverse Laplace transform). The results include a peak interconnect coupling noise estimation.

In deriving these results, the invention provides a complete set of analytic estimators for both the L and Π models and for both step and ramp voltage inputs. Results may be obtained for various combinations of input voltages. Possible combinations of input voltages may be: (i) victim interconnect line quiet at constant level, (ii) victim interconnect line active and switching in a direction opposite to the aggressor's switching direction, and (iii) victim interconnect line active and switching in the same direction as the aggressor (see FIGS. 5a, 5b, 6a, 6b, 7a and 7b, respectively).

It is noted that although results may be obtained for various combinations of input voltages, the following description focuses on one example, the case where the victim interconnect line is quiet at constant level (FIGS. 5a and 5b). Further, input voltages with other than step or ramp wave-forms may be employed with similar yielding of more accurate results. This is so because input voltages of other wave-forms can be expressed, for example, as a piece-wise series of ramps. In each of the possible cases, the results obtained can include a peak value of the interconnect coupling noise at the victim interconnect line.

It is further noted that although the following description illustrates the case of two adjacent interconnect line, the principles of the invention as set forth below apply to any configuration including multiple interconnect lines. For example, although for simplicity we consider just one aggressor interconnect line for a given victim interconnect line, the principles set forth below extend easily to the case of more than one aggressor interconnect line for a given victim interconnect line.

In order to better understand the following description a list of definitions is presented below. (This list correlates to the accompanying FIGS. 2a–c, as well as FIGS. 3, 4, 5a–7b.)

DEFINITIONS

Capacitive coupling: created due to substrate or interlayer dielectric, etc.

Aggressor/victim interconnect lines: active signals (voltage, current) carried by an aggressor interconnect line affect the voltage level at a victim interconnect line.

Node A: an end of the aggressor interconnect line that is connected to a driver gate.

Node B: an end of the aggressor interconnect line that is connected to a load gate.

Node C: an end of the victim interconnect line that is connected to a load gate.

Node D: an end of the victim interconnect line that is connected to a driver gate.

$V_A(S)$: voltage at node A in frequency (Laplace transform) domain.

$V_B(t)$: voltage at node B (at aggressor) in time domain.

$V_B(s)$: voltage at node B in frequency (Laplace transform) domain.

$V_C(t)$: voltage at node C (at victim) in time domain.

$V_C(s)$: voltage at node C in frequency (Laplace transform) domain.

$V_D(s)$: voltage at node D in frequency (Laplace transform) domain $V_0$: peak supply voltage.

$V_{peak}$: peak noise voltage $R_{d1}$: on-resistance (Thévenin equivalent resistance) of the driver gate that is connected to the aggressor interconnect line.

$R_{d2}$: on-resistance (Thévenin equivalent resistance) of the driver gate that is connected to the victim interconnect line.

$R_1$: resistance (total) of the aggressor interconnect line $R'_1$: resistance (total) of victim interconnect line $C_1$: capacitance (to ground) in an L model of the aggressor interconnect line (includes the load gate input capacitance, i.e., load capacitance $C_{L1}$), or a first of the two capacitances in the lumped Π model of the aggressor interconnect line.

$C'_1$: capacitance (to ground) in an L model of the victim interconnect line (includes load capacitance $C_{L2}$), or a first of the two capacitances in the lumped Π model of the victim interconnect line.

$C_2$: a second of the two capacitances in the lumped Π model of the aggressor interconnect line (also includes load capacitance, $C_{L1}$).

$C'_2$: a second of the two capacitances in the lumped Π model of the victim interconnect line (also includes load capacitance, $C_{L2}$).

$C_{c1}$: coupling capacitance between the interconnect lines for L models, or a first coupling capacitance between the interconnect lines for the lumped Π models.

$C_{c2}$: a second coupling capacitance between the interconnect lines for the lumped Π models.

$t_{peak}$: time at which peak noise voltage is reached.

$T_s$: slew (rise) time of a ramp input voltage.

Noise Estimation Using the L Model for Interconnect Lines

Since noise can cause false switching and incorrect functionality, it is important to predict the noise. A worst case scenario is produced by a peak level of the noise and therefore an estimation of the peak noise voltage is also provided.

Figure 3:
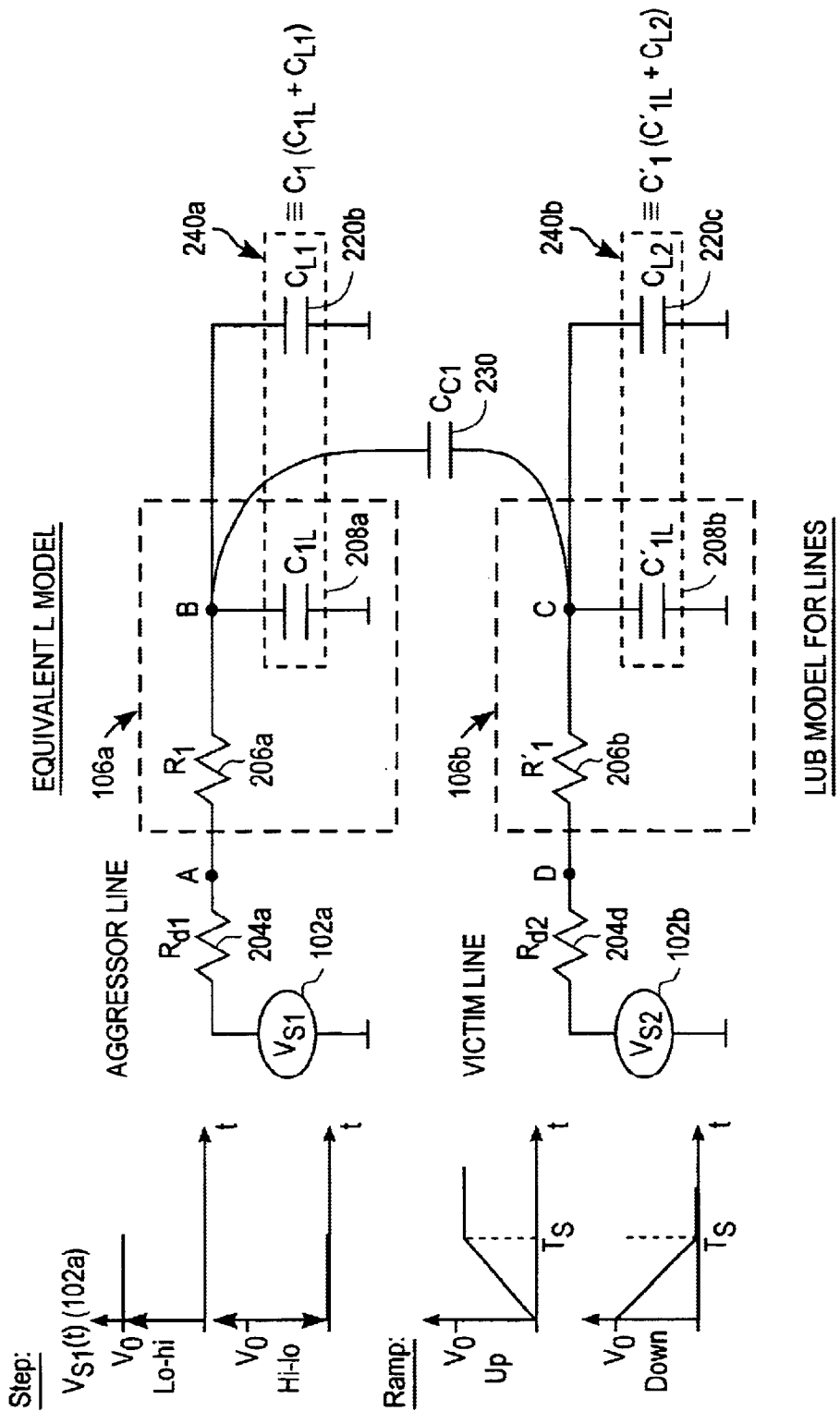
FIG. 3 illustrates a lumped L circuit model of two multistage circuits having L modeled interconnect lines proximate to each other and coupled by a coupling capacitance, according to an embodiment of the invention.

In this part of the description, the L model is used to represent interconnect lines. FIG. 3 is a circuit model of two multistage circuits having L modeled interconnect lines proximate to each other and coupled by a coupling capacitance.

As shown in FIG. 3, one of the multistage circuits includes the L modeled aggressor interconnect line 106a. The second multistage circuit includes the L modeled victim interconnect line 106b. The capacitance, $C_1$ 240a and $C'_1$ 240b, in the respective multistage circuit is a combination of the respective L model capacitance, $C_{1L}$ 208a and $C'_{1L}$ 208b, and load capacitance, $C_{L1}$ 220b and $C_{L2}$ is 220c. That is:

$$C_1 = C_{1L} + C_{L1};$$

and $$C'_1 = C'_{1L} + C_{L2}.$$

A Thévenin equivalent is used to model each of the driver gates 104a and 104d, respectively. In the Thévenin equivalent model the gate is replaced by an effective impedance driven by a voltage source, $V_{s1}$ 102a or $V_{s2}$ 102b. In this example, the impedance is approximated to a resistance, $R_{d1}$ 204a or $R_{d2}$ 204d.

To estimate the noise voltage at the victim interconnect line 106b due to the crosstalk from the aggressor interconnect line 106a, the results for both the step and ramp input voltages are examined. For this analysis, a set of equations for voltages at nodes C and B characterize the circuits as modeled. In the frequency (Laplace transform) domain the equations are:

$$\frac{V_{S_1} - V_B(s)}{R_{d_1} + R_1} = V_B(s) \cdot sC_1 + (V_B(s) - V_C(s)) \cdot sC_{C_1} \quad (a)$$

$$\frac{V_{S_2} - V_C(s)}{R_{d_2} + R'_1} = V_C(s) \cdot sC'_1 + (V_C(s) - V_B(s)) \cdot sC_{C_1} \quad (b)$$

Using the equations (a) and (b), and assuming that $V_{s2}=0$ volts, the voltages at nodes B and C, $V_B(s)$ and $V_C(s)$, assume the following form:

$$V_B(s) = V_{S_1} \frac{1 + a_1 s}{1 + sM_1 + s^2 M_2} \quad (1)$$

$$V_C(s) = V_{S_1} \frac{1 + a_2 s}{1 + sM_1 + s^2 M_2} \quad (2)$$

where $$M_1[(R_{d_1}+R_1)(C_1+C_{C_1})+(R_{d_2}+R'_1)(C'_1+C_{C_1})]$$

$$M_2 = (R_{d_1}+R_1)(R_{d_2}+R'_1)(C_1 C_{C_1}+C_{C_1}C'_1+C'_1 C_1)$$

$$a_1 = (R_{d_2}+R'_1)(C'_1+C_{C_1})$$

$$a_2 = (R_{d_2}+R'_1)C_{C_1}. \quad (3)$$

The peak noise voltage at the victim interconnect line can be determined from the foregoing expressions for a quiet victim interconnect line. The peak noise voltage is determined under both ($V_{s1}$) conditions of input voltage: (i) step input voltage, and (ii) ramp input voltage. Hence, the discussion of the circuit model of FIG. 3 is accompanied by a reference to the circuits of FIGS. 5a and 5b. FIGS. 5a and 5b illustrate a pair of multistage circuits where the victim interconnect line is quiet at constant voltage level. In FIG. 5a, one the circuits is driven by a step input voltage, and in FIG. 5b, this circuit is driven by a ramp input voltage. Under both conditions, the input voltage drives the multistage circuit with the aggressor interconnect line.

Step Input Analysis

For proceeding with the above analysis using the step input analysis, the circuit of FIG. 3 is driven in a manner as shown in FIG. 5a. Assuming, for example, that the step input voltage switches from low to high and that:

$V_{S_1}(t) = v_0 \cdot u(t)$ in the time domain, and $$V_{S_1}(s) = \frac{v_0}{s}$$

in the frequency (Laplace transform) domain. Assuming also that $V_{S_2}=0$. u(t) represents a unit step function which can be expressed as follows:

$u(t)=0$ for $t<0$;

and $u(t)=1$ for $t \geq 0$.

The voltages at nodes B and C are expressed in the time-domain by:

$$v_B(t) = v_0(1 + k_1 e^{s_1 t} + k_2 e^{s_2 t}) \quad (4)$$

$$V_C(t) = v_0 \frac{a_2}{M_2(s_1 - s_2)}(e^{s_1 t} - e^{s_2 t}) \quad (5)$$

where $$k_1 = \frac{1 + a_1 s_1}{s_1 M_2 (s_1 - s_2)},$$

$$k_2 = \frac{1 + a_1 s_2}{s_2 M_2 (s_1 - s_2)},$$

and $S_1$ and $S_2$ are:

$$s_{1,2} = \frac{-M_1/M_2 \pm \sqrt{(M_1/M_2)^2 - 4/M_2}}{2}.$$

The voltages at nodes B and C, are the resulting signal at the aggressor interconnect line and the resulting interconnect coupling noise at the victim interconnect line, respectively. The peak noise voltage is determined by differentiating equation (5) with respect to t and equating the result to zero. The time at which peak noise voltage is reached is given by:

$$t_{peak} = \frac{1}{s_1 - s_2} \ln(s_2/s_1) \quad (6)$$

and the peak voltage is:

$$v_{peak} = \frac{a_2 v_0}{M_2(s_1 - s_2)} \left( \frac{s_2^{s_1/(s_1-s_2)}}{s_1} - \frac{s_2^{s_2/(s_1-s_2)}}{s_1} \right) \quad (7)$$

Hence, by accounting for both $M_1$ and $M_2$, the invention produces a more accurate peak noise voltage estimation. By using a first order approximation, where $M_2$ is ignored, the noise voltage at node C becomes:

$$v_C(t) = \frac{v_0(R_{d_2} + R_1')C_{C_1}}{M_1} e^{-\frac{1}{M_1}t},$$

and a peak noise voltage value (noise amplitude upper bound) of:

$$v_{peak(UB)} = \frac{v_0 a_2}{M_1} = \frac{v_0(R_{d_2} + R_1')C_{C_1}}{M_1}. \quad (8)$$

Because empirical results suggest that the above obtained peak noise expression provides a relative upper bound of the peak noise voltage value, the L model under the above-noted conditions is also referred to as the LUB model. Estimation of upper bounds of peak noise voltage is useful for predicting worst case conditions.

It is further shown that, by comparison, if interconnect lines resistances, $R_1$ and $R'_1$, are ignored, a less accurate peak noise voltage estimation is derived. With $R_1$ and $R'_1$ being set to zero the peak noise voltage is:

$$v_{peak} = \frac{v_0}{(1 + C_1'/C_{C_1} + R_{d_1}/R_{d_2} \cdot (1 + C_1/C_2))}$$

The foregoing comparison has shown that, in accordance with the purpose of the invention, the noise and peak noise voltages can be more accurately estimated as reflected in equations (5) and (7). Moreover, the upper bound of the peak noise voltage can be estimated as reflected in equation (8). As indicated before, these estimations are made for a step input voltage as the source.

Ramp Input Analysis

Alternatively, proceeding with a ramp input analysis, the circuit of FIG. 3 is driven by a ramp input voltage in a manner as shown in FIG. 5b. The ramp input voltage in the time and frequency (Laplace transform) domains, respectively, is expressed as:

$$V_{S_1}(t) = \frac{v_0}{T_s} \cdot t \cdot u(t) - \frac{v_0}{T_s}(t - T_S) \cdot u(t - T_S), \text{ and}$$

$$V_{S_1}(s) = \frac{v_0}{s^2 T_s}(1 - e^{-sT_S})$$

where, as mentioned before, $T_s$ is the slew (rise) time of the ramp input voltage. As also mentioned before, u(t) represents a unit step function which can be expressed as follows:

$u(t)=0$ for $t<0$;

and $u(t)=1$ for $t \geq 0$.

substituting this expression for $V_{s1}$ in equation (2), the noise voltage at node C can be expressed in the frequency (Laplace transform) domain as:

$$V_C(s) = \frac{v_0}{s^2 T_s}(1 - e^{-sT_S}) \cdot \frac{a_2 s}{1 + sM_1 + s^2 M_2}. \quad (9)$$

By applying partial fractions with respect to equation (9), the noise voltage can be further expressed as:

$$V_C(t) = \qquad (10)$$
$$\frac{v_0 a_2}{s^2 T_S}\left[1 + \frac{1}{M_2 s_1(s_1-s_2)}e^{-s_1 t} - \frac{1}{M_2 s_2(s_1-s_2)}e^{-s_2 t}\right] \text{ for } t \leq T_S$$

$$V_C(t) = \frac{v_0 a_2}{s^2 T_S}\left[1 + \frac{1}{M_2 s_1(s_1-s_2)}(e^{s_1 t} - e^{s_1(t-T_S)}) - \right.$$
$$\left. \frac{1}{M_2 s_2(s_1-s_2)}(e^{s_1 t} - e^{s_1(t-T_S)})\right] \text{ for } t > T_S.$$

The peak noise voltage is derived by differentiating equation (10) with respect to t and equating the result to zero. From the noise voltage expression for $t > T_s$ (equation (10)), the time at which the noise voltage, $v_c(t)$, reaches its peak value is:

$$t_{peak} = \frac{1}{(s_1-s_2)}\ln\left(\frac{1-e^{s_2 T_S}}{1-e^{s_1 T_S}}\right)$$

The corresponding peak noise voltage is determined as follow:

$$v_{peak} = \frac{v_0 a_2}{T_S}\left[\frac{1-e^{-s_1 T_S}}{M_2 s_1(s_1-s_2)}\left(\frac{1-e^{-s_2 T_S}}{1-e^{-s_1 T_S}}\right)^{s_1/(s_1-s_2)} - \right.$$
$$\left. \frac{1-e^{-s_2 T_S}}{M_2 s_2(s_1-s_2)}\left(\frac{1-e^{-s_2 T_S}}{1-e^{-s_1 T_S}}\right)^{s_2/(s_1-s_2)}\right] \qquad (11)$$

An upper bound of the peak noise voltage can be determined by approximating the noise voltage at node C, $v_c(t)$, to the first moment as follows:

$$v_{peak(UB)} = \frac{v_0(R_{d_2}+R'_1)C_{C_1}}{T_S}(1-e^{-T_S/M_1}). \qquad (12)$$

The foregoing illustrates that for the ramp input voltage, the noise and peak noise voltages can be more accurately estimated via equations (10) and (11). Moreover, for ramp input voltage the upper bound of the peak noise voltage can be estimated as reflected in equation (12).

As stated before, the estimations are determined with respect to the L model for representing interconnect lines. In the L model, the entire interconnect resistance ($R_1$, FIG. 3) is loaded by the total interconnect capacitance ($C_1$). Accordingly, the noise peak estimated in this model appears to serve as an upper bound estimator for the noise voltage peak.

Noise Estimation Using the Π Model for Interconnect Lines

In this part of the description, the lumped Π model is used to represent the interconnect lines. As set forth below, implementation of the lumped Π model for representing the interconnect lines advantageously produces a superior noise voltage estimation. Namely, results with the lumped Π model are superior to results with the L model. (Hereafter, the lumped Π model is referred to in short as the "Π model.")

Figure 4:
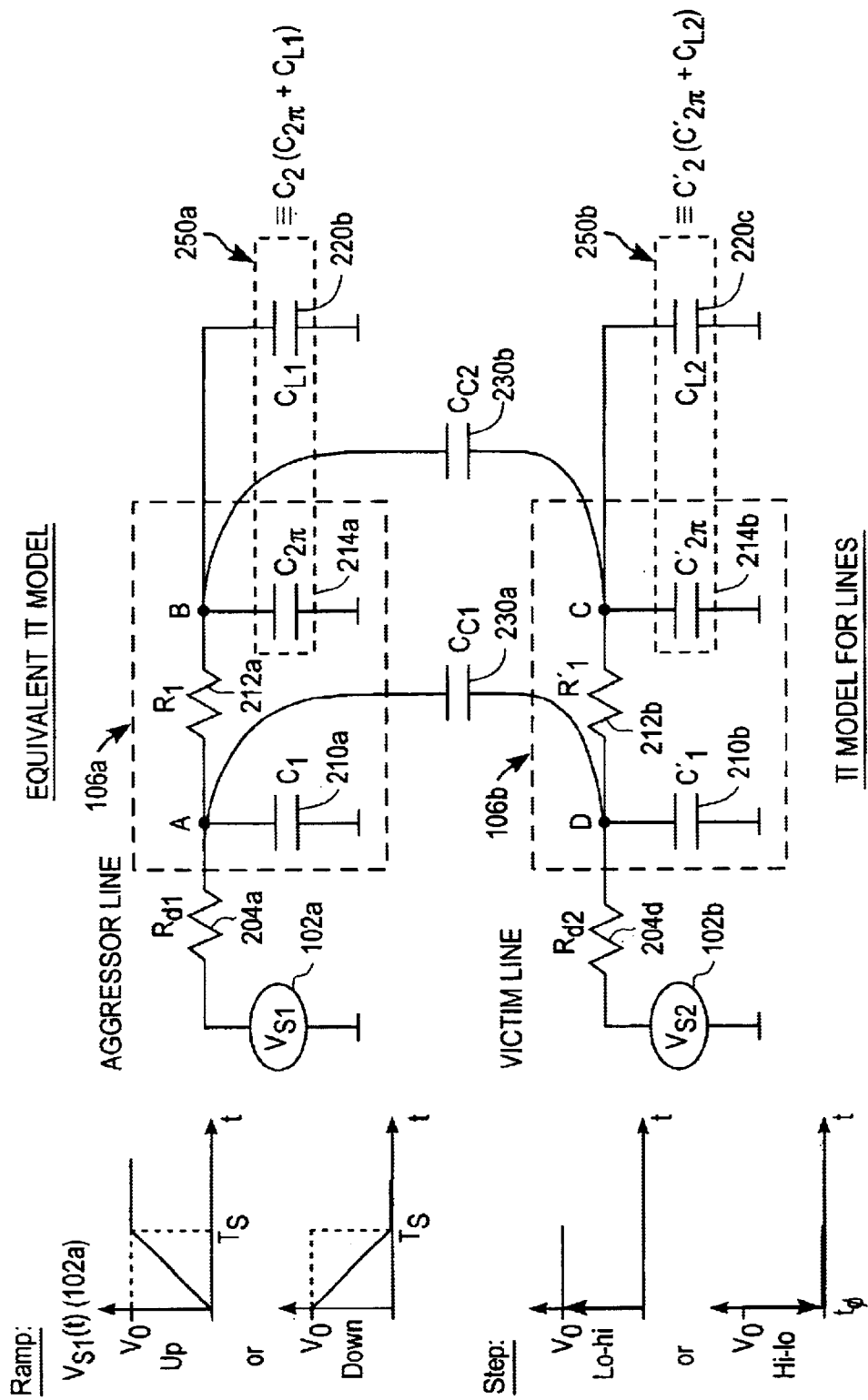
FIG. 4 illustrates a lumped Π circuit model of two multistage circuits having L modeled interconnect lines proximate to each other and coupled by a coupling capacitance, according to an embodiment of the invention.
Figure 8:
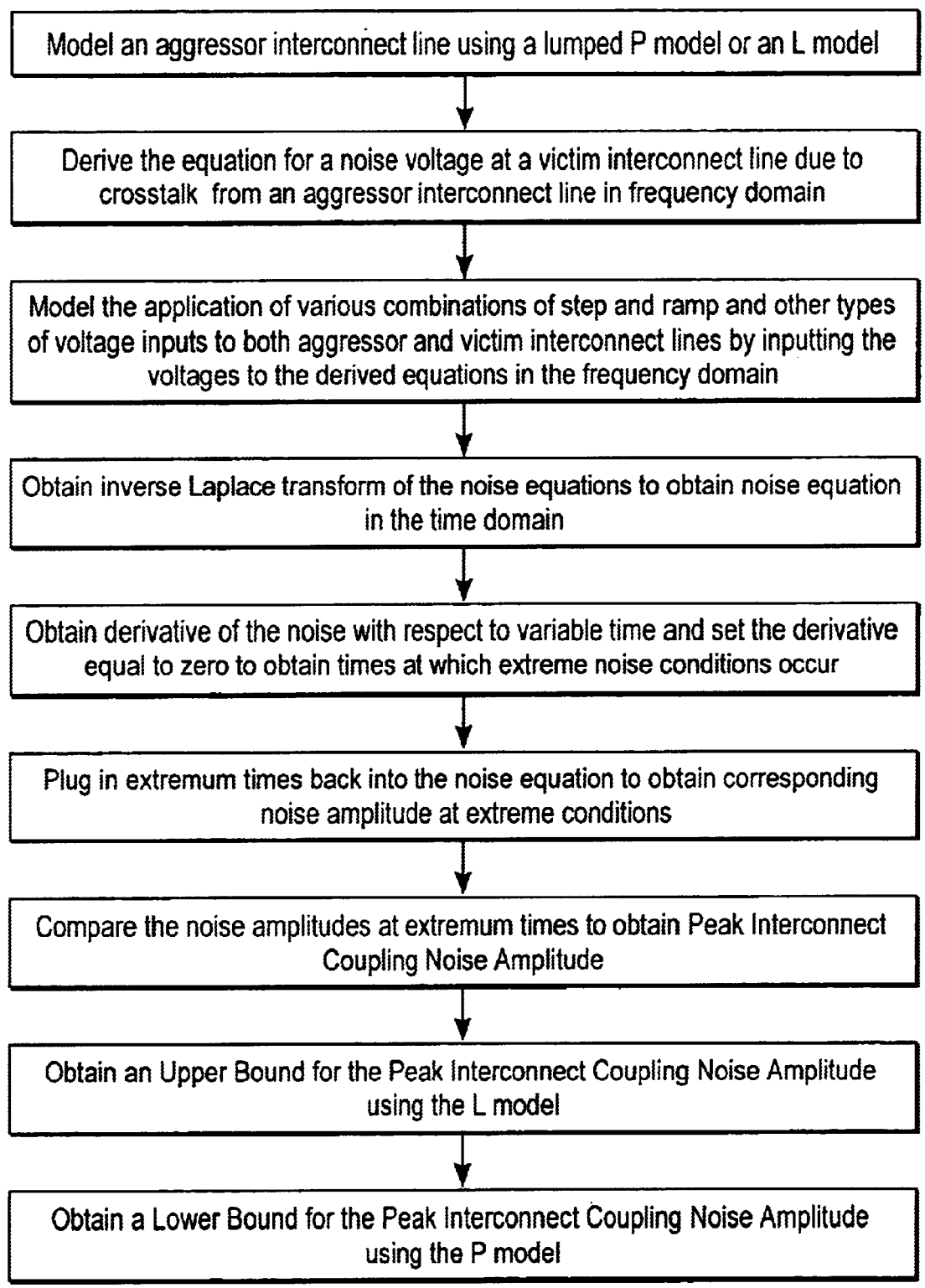
FIG. 8 is a flowchart illustrating a method according to an embodiment of the invention.

FIG. 4 is a circuit model of two multistage circuits having Π modeled interconnect lines proximate to each other and coupled by a coupling capacitance pair. One of the multistage circuits includes the Π modeled aggressor interconnect line 106*a*. The second multistage circuit includes the Π modeled victim interconnect line 106*b*.

The capacitance, $C_2$ 250*a* and $C'_2$ 250*b*, in the respective multistage circuit is a combination of the respective Π model second capacitance, $C_{2\Pi}$ 214*a* and $C'_{2\Pi}$ 214*b*, and load capacitance, $C_{L1}$ 220*b* and $C_{L2}$ 220*c*. That is:

$$C_2 = C_{2\Pi} + C_{L1};$$

and $$C'_2 + C'_{2\Pi} + C_{L2}.$$

It is noted that, as shown in FIG. 4, the modeled interconnect line capacitance is distributed into two parts (capacitance to ground, $C_1$ 210*a*, $C^1$ 210*b*, $C_{2\Pi}$ 214*a* and $C'_{2\Pi}$ 214*b*, and coupling capacitance $C_{C1}$ 230*a* and $C_{C2}$ 230*b*).

The Thévenin equivalent is used to model each of the driver gates 104*a* and 104*d*, respectively. In the Thévenin equivalent model each gate is replaced by an effective impedance driven by a voltage source, $V_{s1}$ 102*a* or $V_{s2}$ 102*b*. In this example, the impedance is approximated to a resistance, $R_{d1}$ 204*a* or $R_{d2}$ 204*d*.

To estimate the noise voltage at the victim interconnect line 106*b* due to the crosstalk from the aggressor interconnect line 106*a*, the results for both the step and ramp input voltages are examined. For this analysis, the following equations set forth the relationship between voltages at nodes A, B, C and D of the circuits as modeled. In the frequency (Laplace transform) domain the equations are:

$$V_{S_1} = V_A + R_{d_1}[V_A s C_1 + (V_A - V_D)s C_{C_1} + V_B s C_2 + (V_B - V_C)s C_{C_2}]$$

$$V_A = V_B + R_1[V_B s C_2 + (V_B - V_C)s C_{C_2}]$$

$$V_{S_2} = V_D R_{d_2}[V_D s C'_1 + (V_D - V_A)s C_{C_1} + V_C s C'_2 + (V_C - V_B)s C_{C_2}]$$

$$V_D = V_C + R'_1[V_C s C'_2 + (V_C - V_B)s C_{C_2}] \qquad (14)$$

The peak noise voltage at the victim interconnect line 106*b* can be determined from the foregoing expressions for a quiet victim interconnect line 106*b*. The noise voltage and peak noise voltage is determined under both ($V_{s1}$ 102*a*) conditions of input voltage: (i) step input voltage, and (ii) ramp input voltage. Hence, the discussion of the circuit model of FIG. 4 is accompanied by a reference to the circuits of FIGS. 5*a* and 5*b*.

It may be recalled that FIGS. 5*a* and 5*b* illustrate a pair of multistage circuits where the victim interconnect line is quiet at constant voltage level. In FIG. 5*a*, one of the circuits is driven by a step input voltage, and in FIG. 5*b*, this circuit is driven by a ramp input voltage. Under both conditions, the input voltage drives the multistage circuit with the aggressor interconnect line.

As stated before, the victim interconnect line is quiet at low voltage, while the voltage at the aggressor interconnect line is switching or ramping from low to high. Assuming for this purpose that the source for the victim interconnect line is at zero volts, i.e., $V_{S_2}=0$ volts. Then, the transfer characteristics for coupling noise of the Π modeled circuits can be derived from the above equations (14) as follows (were the result is approximated to the second moment only):

$$\frac{V_C(s)}{V_{S_1}} = \frac{a_1 s + a_2 s^2}{1 + b_1 s + b_2 s^2} \qquad (15)$$

$$\frac{V_B(s)}{V_{S_1}} = \frac{1 + c_1 s + c_2 s^2}{1 + b_1 s + b_2 s^2} \qquad (16)$$

where $a_1 = R_1 C_{C_2}$ $+ R_{d_2} C_{C_1} + R_{d_2} C_{C_2},$ $a_2 = R_{d_2} C'_1 R'_1 C_{C_2}$ $+ R_{d_2} C_{C_1} R'_1 C_{C_2}$ $+ R_{d_2} C_{C_1} R_1 C_2$ $+ R_{d_2} C_{C_1} R_1 C_{C_2},$ $b_1 = R'_1 C_{C_2}$ $+ R_{d_2} C_{C_2}$ $+ R_{d_2} C_{C_1} + R'_1 C'_2$ $+ R_{d_1} C_{C_1} + R_{d_1} C_{C_2}$ $+ R_1 C_{C_2} + R_{d_2} + C'_1$ $+ R_{d_1} C_1 + R_{d_2} C'_2$ $+ R_1 C_2 + R_{d_1} C_2,$ $b_2 = R_{d_2} C'_1 R'_1 C_{C_2}$ $+ R_{d_2 C_1} R'_1 C_{C_2}$ $+ R_{d_2} C_{C_1} R_1 C_{C_2}$ $+ R_{d_2 C_1} R_1 C_2$ $+ R_{d_1} C_2 R'_1 C_{C_2}$ $+ R_{d_1} C'_2 R_{d_2} C'_1$ $+ R_{d_1} C_2 R_{d_2} C_{C_1}$ $+ R_{d_1} C_2 R_{d_2} C'_2$ $+ R_{d_1} C_2 R_{d_2} C_{C_2}$ $+ R_{d_1} C_1 R'_1 C'_2$ $+ R_{d_1} C'_1 R'_1 C_{C_2}$ $+ R_{d_1} C_1 R_{d_2} C'_1$ $+ R_{d_1} C_1 R_{d_2} C_{C_1}$ $+ R_{d_1} C_1 R_{d_2} C'_2$ $+ R_{d_1} C_1 R_{d_2} C_{C_2}$ $+ R_{d_2} C'_1 R'_1 C'_2$ $+ R_1 C_2 R'_1 C'_2$ $+ R_1 C_2 R'_1 C_{C_2}$ $+ R_1 C_2 R_{d_2} C'_1$ $+ R_{d_2} C_{C_1} R'_1 C'_2$ $+ R_{d_1} C_{C_1} R'_1 C'_2$ $+ R_{d_1} C_{C_1} R'_1 C_{C_2}$ $+ R_{d_1} C_{C_2} R'_1 C'_2$ $+ R_{d_1} C_{C_2} R_{d_2} C'_1$ $+ R_{d_1} C_2 R_{d_2} C'_2$ $+ R_{d_1} C_{C_1} R_{d_2} C'_1$ (17)

$+ R_{d_1} C_{C_1} R_{d_2} C'_2$ $+ R_1 C_2 R_{d_2} C'_2$ $+ R_1 C_2 R_{d_2} C_{C_2}$ $+ R_1 C_{C_2} R'_1 C'_2$ $+ R_1 C_{C_2} R_{d_2} C'_1$ $+ R_1 C_{C_2} R_{d_2} C'_2$ $+ R_{d_1} C_2 R'_1 C'_2,$ $c_1 = R'_1 C_{C_2} + R_{d_2} C'_1 + R_{d_2} C_{C_1} + R'_1 C'_2 + R_{d_2} C'_2 + R_{d_2} C_2,$ and $c_2 = R_{d_2} C'_1 R'_1 C'_2 + R_{d_2} C'_1 R'_1 C_{C_2} + R_{d_2} C_{C_1} R'_1 C'_2 + R_{d_2} C_{C_1} R'_1 C_{C_2} + R_{d_2} C_{C_1} R_1 C_{C_2}.$ Ramp Input Analysis For proceeding with the ramp input analysis, the circuit of FIG. 4 is driven in a manner as shown in FIG. 5*b*. As before, $V_{S_2}=0$. It may be further recalled that in the time and frequency (Laplace transform) domains, respectively, the ramp input voltage Is:

$$V_{S_1}(t) = \frac{v_0}{T_s} \cdot t \cdot u(t) - \frac{v_0}{T_s}(t-T_S) \cdot u(t-T_S), \text{ and}$$

$$V_{S_1}(s) = \frac{v_0}{s^2 T_S}(1-e^{-sT_S}),$$

where u(t) represents a unit step function which can be expressed as follows:

$u(t)=0$ for $t<0$;

and $u(t)=1$ for $t \geq 0$.

Then, the noise voltage at node C (at the victim interconnect line 106*b*) can be provided in the frequency (Laplace transform) domain as:

$$V_C(s) = \frac{v_0(1-e^{-sT_S})}{T_S b_2}\left[\frac{k_0}{s} + \frac{k_1}{s-s_1} + \frac{k_2}{s-s_2}\right].$$

The corresponding time-domain expression of the noise voltage at the victim interconnect line is given by:

$$V_C(t) = \frac{v_0}{b_2 T_S}[k_0 + k_1 e^{s_1 t} + k2 e^{s_2 t}] \text{ for } t \leq T_S \quad (18)$$

$$V_C(t) = \frac{v_0}{b_2 T_S}[k_1(e^{s_1 t} - e^{s_1(t-T_S)}) + k_2(e^{s_2 t} - e^{s_2(t-T_S)})] \text{ for } t > T_S.$$

Where $k_0 = a_1 b_2,$ (19)

$$k_1 = -\frac{b_2(a_2 + s_2 b_2 a_1)}{2 s_2 b_2 + b_1},$$

$$k_2 = \frac{b_2(-s_2 b_2 a_1 - a_1 b_1 + a_2)}{2 s_2 b_2 + b_1}, \text{ and}$$

-continued $$s_1 s_2 = \frac{-\frac{b_1}{b_2} \pm \sqrt{\left(\frac{b_1}{b_2}\right)^2 - \frac{b_1}{b_2}}}{2}.$$

Under the input voltage conditions as outlined above, the voltage $v_C(t)$ at the victim interconnect line is the noise voltage. As explained, due to the coupling from the aggressor interconnect line, the noise voltage appears at the victim interconnect line when the aggressor interconnect line is active.

To find the peak noise voltage for this configuration, equation (18) is differentiated with respect to t and the resulting derivative is set to zero. The time at which peak noise is reached is determined as follows:

$$t_{peak_1} = \left(\frac{1}{s_2 - s_1}\right)\ln\left(-\frac{k_1 s_1}{k_2 s_2}\right) \quad 0 \leq t_{peak} \leq T_S \quad (20)$$

$$t_{peak_2} = \left(\frac{1}{s_2 - s_1}\right)\ln\left\{\left(-\frac{k_1 s_1}{k_2 s_2}\right)\left(\frac{1 - e^{-s_1 T_S}}{1 - e^{-s_2 T_S}}\right)\right\} \quad t_{peak_2} > T_S.$$

By substituting, one at a time, each of the above $t_{peak}$ values for t in Equation (18), the peak noise voltage can be obtained as follows:

$$v_C(t_{peak}) = \max\{v_C(t_{peak_1}), v_C(t_{peak_2})\}.$$

In other words, the peak voltage for a ramp input voltage may occur either before or after the slew time, $T_S$ of the ramp input voltage.

Step Input Analysis

For alternatively proceeding with the step input analysis, the circuit of FIG. 4 is driven in a manner as shown in FIG. 5a. Assuming, as before, that the step input voltage switches from low to high and that:

$$V_{S_1}(s) = \frac{v_0}{s}.$$

Assuming also that $V_{S_2}=0$. From the transfer characteristics as expressed in equation (15), the voltage at node C (i.e. the voltage at the victim interconnect line) can be expressed in the frequency (Laplace transform) domain as:

$$V_C(s) = v_0 \frac{a_1 + a_2 s}{1 + b_1 s + b_2 s^2} = \frac{v_0}{b_2}\left[\frac{k_1}{s - s_1} + \frac{k_2}{s - s_2}\right]$$

Using partial fractions and inverse Laplace transforms of the above equation can be expressed in time-domain as:

$$v_C(t) = \frac{v_0}{b_2}(k_1 e^{s_1 t} + k_2 e^{s_2 t}) \quad (21)$$

where $$k_1 = -\frac{s_2 a_2 b_2 - a_1 b_2 + a_2 b_1}{2 s_2 b_2 + b_1}, \quad (22)$$

$$k_2 = -\frac{b_2(s_2 a_2 + a_1)}{2 s_2 b_2 + b_1}, \text{ and}$$

-continued $$s_1 s_2 = \frac{-\frac{b_1}{b_2} \pm \sqrt{\left(\frac{b_1}{b_2}\right)^2 - \frac{b_1}{b_2}}}{2}.$$

Again, the voltage at node C, $V_c(t)$, represents noise voltage at the victim interconnect line due to switching of the signal (voltage, current) at the aggressor line. To find the peak noise voltage for this configuration, Equation (21) is differentiated with respect to t and the result (derivative) is set to zero. The time, $t_{peak}$, at which peak noise is reached is determined as follows:

$$t_{peak} = \left(\frac{1}{s_2 - s_1}\right)\ln\left(-\frac{k_1 s_1}{k_2 s_2}\right) \quad (23)$$

where the peak noise voltage is determined by:

$$v_{C,peak}(t) = v_C(t_{peak}) \quad (24)$$

As stated before, these estimations are derived with respect to the Π model for representing the interconnect lines. In the Π model, the interconnect resistance ($R_1$) is loaded with half of the interconnect capacitance ($C_1/2$). Accordingly, the noise peak estimated in this model appears to serve as a relative low bound estimator for the noise voltage peak.

In summary, improved noise estimates can be derived using the above-described, more accurate circuit modeling techniques. Specifically, the above-presented analytical expressions for noise voltage describe the impact of the capacitive coupling between the aggressor and victim interconnect lines. This impact is described for both the step input and ramp input voltages.

The principles of the invention apply equally well to input voltages with other than step or ramp wave-forms because input voltages of other wave-forms can be expressed, for example, as a piece-wise series of ramps. In other words, the invention provides a more accurate interconnect coupling noise estimation for any input voltage, whether having step, ramp or other wave-form.

Furthermore, the presented approach extends easily to other modes of simultaneous switching, phase offsets, etc. The results produced by this approach include easy to evaluate expressions for crosstalk and noise amplitude. These expressions for both L and Π modeled interconnect lines have been demonstrated to be more general and accurate. The accuracy achieved in the Π model case proves superior.

It should be understood that, although the principles of the invention are applied herein to determine the peak noise voltage for two coupled interconnect lines, these principles can be extended to the case of multiple aggressor interconnect lines effecting a victim line. In the multiple aggressor interconnect lines case, the impact on the victim interconnect line of each aggressor interconnect line can be independently analyzed. Namely, taking each aggressor interconnect line separately, the overlapping sections of the aggressor and victim interconnect lines are analyzed, one section at a time, to determine noise voltage peaks. From the principle of voltage super-position the noise voltage peaks for each section can be added up to produce the total noise peak impact of the specific aggressor interconnect line. Moreover, the foregoing principles apply to various configurations of interconnect lines length, width, and spacing.

In accordance with a purpose of the invention, a computer system can be used in which an embodiment of the invention is implemented. The invention can be implemented in the computer system as a separate tool or as part of other design automation tools. For implementing an embodiment of the invention in the computer system, the principles of the invention as presented above can be stored in a computer readable medium in the form of computer program code. Moreover, the library of cells (gate library) may be stored in a computer readable medium. The computer readable medium includes internal or external, fixed or removable, computer memory.

The improved modeling accuracy and, in turn, the more accurate interconnect coupling noise predictions are advantageous in several respects. One advantage is improved analysis of circuit performance sensitivity to various interconnect tuning parameters. Another advantage is the lesser overdesign and guardbanding in high-performance designs. Yet another advantage is the shorter runtime it takes to analyze the circuits when using a computer to embody the invention. These advantages apply at all stages of a performance-convergent synthesis and layout methodology. Finally, the approach presented herein can be advantageously used as an analytical tool to estimate the impact of noise voltage peaks early on in the physical design cycle of integrated circuits such as microprocessors, ASIC (application specific IC) etc.

Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A method for interconnect coupling noise estimation, comprising:

modeling a circuit, the circuit including a pair of interconnects so that signal activity at a first interconnect of the pair of interconnects is having an impact on a second interconnect of the pair of interconnects, the circuit modeling including modeling the first and second interconnects;

expressing transfer characteristics of the modeled circuit for one of or, each one at a time, for a plurality of input voltages including step and ramp input voltages;

expressing a second interconnect voltage at the second interconnect based on the transfer characteristics, the second interconnect voltage representing the impact on the second interconnect that is in the form of interconnect coupling noise; and determining a peak value of the interconnect coupling noise from the expression for the second interconnect voltage at the second interconnect, the interconnect coupling noise reaching a peak at a time determined for the one of or, each one at a time, for the plurality of input voltages including step and ramp input voltages, the determining the peak value of the interconnect coupling noise including:

differentiating the expression for voltage at the second interconnect with respect to the time;

setting the resulting first derivative to zero;

determining the times at which the interconnect coupling noise is reaching an extremum;

differentiating the said first derivative to obtain a second derivative;

determining the sign of the second derivative at each extremum to determine whether each extremum was a maximum or a minimum or an inflection point;

plugging the times corresponding to maxima into the expression for the voltage;

determining an absolute maximum as a time at which the interconnect coupling noise is reaching a peak value; and plugging the time, corresponding to the absolute maximum, into the expression for the voltage, wherein, an upper bound for the peak value of the interconnect coupling noise is calculated using a lumped L model and a lower bound for the peak value of the interconnect coupling noise is calculated using a lumped P model; and wherein the circuit is modeled for a plurality of input voltages combination of including a first combination where the second interconnect is quiet at a constant voltage level; a second combination where the second interconnect is active and switching in a direction opposite to a switching direction of first interconnect; and a third combination where in the second interconnect is active and switching in the same direction as a switching direction of the first interconnect.

2. The method of claim 1, wherein the interconnect coupling noise estimation is for coupled interconnects in deep submicron integrated circuits.

3. The method of claim 1, wherein the impact on the second interconnect is due to crosstalk between the first and second interconnects that results from capacitive coupling between the first and second interconnects, wherein the transfer characteristics include the capacitive coupling, wherein the modeled circuit further includes a capacitance between the first and second interconnects that represents the capacitive coupling, and wherein inductive coupling is not included.

4. The method of claim 1, wherein the second interconnect is quiet at a constant voltage level, and wherein a portion of the modeled circuit that includes the first interconnect is driven by one of or, each one at a time, by both of the step and ramp input voltages.

5. The method of claim 1, wherein the modeling of the first and second interconnects implements a lumped P model for representing each of the first and second interconnects, wherein capacitive coupling between the first and second interconnects is represented by a capacitance connected between the lumped P models, and wherein implementation of the lumped P models produces a noise voltage estimation with superior accuracy.

6. The method of claim 5, wherein each of the lumped P models is a single network segment that approximates the distributed impedance nature of the respective one of the first and second interconnects, each of the lumped P models including a total resistance and a capacitance to ground on each side of the total resistance.

7. The method of claim 5, wherein the transfer characteristics of the modeled circuit, the second interconnect voltage at the second interconnect and the peak value of the interconnect coupling noise are expressed in view of the capacitive coupling between the first and second interconnects and the lumped P model implementation for representing the first and second interconnects, the capacitance representing the capacitive coupling being distributed among first and second capacitances connected between the lumped P models.

8. The method of claim 1, wherein the circuit further includes first and second multistage circuits each having a driver and load gate and the first and second interconnects, respectively, the driver and load gates in each of the first and second multistage circuits being connected via the first and second interconnects, respectively, the driver gate in each of the first and second multistage circuits being modeled by a Thévenin equivalent, the load gate in each of the first and second multistage circuits being modeled by a load capacitance approximating an input impedance of the respective load gate, the modeled driver and load gates and the modeled first and second interconnects combine to form the modeled circuit.

9. The method of claim 1, wherein the modeling of the first and second interconnects implements an L model for representing each of the first and second interconnects, wherein each of the L models includes an interconnect resistance and a capacitance, wherein capacitive coupling between the first and second interconnects is represented by a coupling capacitance connected between the L models, and wherein implementation of the L models produces a more accurate noise voltage estimation by accounting for the interconnect resistance of the first and second interconnects and by including both first and second moments in the expression for the second interconnect voltage at the second interconnect.

10. The method of claim 9, wherein the transfer characteristics of the modeled circuit, the second interconnect voltage at the second interconnect and the peak value of the interconnect coupling noise are expressed in view of a capacitive coupling between the first and second interconnects and the L model implementation for representing the first and second interconnects.

11. The method of claim 1, being implemented in a computer system.

12. The method of claim 1, wherein expressing transfer characteristics of the modeled circuit is done for at least a ramp input voltage and a step input voltage.

13. The method of claim 1, wherein expressing transfer characteristics of the modeled circuit is done for a plurality of ramp input voltages.

* * * * *